United States Patent
Baragur Suryanarayana et al.

(10) Patent No.: US 10,784,829 B2
(45) Date of Patent: Sep. 22, 2020

(54) CURRENT SENSE CIRCUIT STABILIZED OVER WIDE RANGE OF LOAD CURRENT

(71) Applicant: TEXAS INSTRUMENTS INCORPORATED, Dallas, TX (US)

(72) Inventors: Dattatreya Baragur Suryanarayana, Bengaluru (IN); Kushal D Murthy, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 18 days.

(21) Appl. No.: 16/222,849

(22) Filed: Dec. 17, 2018

(65) Prior Publication Data

US 2020/0014350 A1 Jan. 9, 2020

(30) Foreign Application Priority Data

Jul. 4, 2018 (IN) .............................. 201841024891

(51) Int. Cl.
*H03F 1/52* (2006.01)
*H03F 3/45* (2006.01)

(52) U.S. Cl.
CPC ..... *H03F 3/45273* (2013.01); *H03F 3/45174* (2013.01); *H03F 2200/462* (2013.01)

(58) Field of Classification Search
CPC . H03F 1/52; H03F 1/523; G05F 1/569; G05F 1/573
USPC .......................... 330/207 P, 298; 323/276, 277
See application file for complete search history.

(56) References Cited

U.S. PATENT DOCUMENTS

| 8,648,586 | B2 | 2/2014 | Singh et al. |
| 9,444,414 | B2 | 9/2016 | Peluso |
| 2012/0038332 | A1* | 2/2012 | Lin .......................... G05F 1/575 323/277 |
| 2016/0266178 | A1 | 9/2016 | Gerna et al. |

OTHER PUBLICATIONS

Search Report for PCT Application No. PCT/US19/40370, dated Oct. 24, 2019, 1 page.

* cited by examiner

*Primary Examiner* — Steven J Mottola
(74) *Attorney, Agent, or Firm* — Lawrence J. Bassuk; Charles A. Brill; Frank D. Cimino

(57) ABSTRACT

A circuit includes a power transistor including a first control input and first and second current terminals, the second current terminal to be coupled to a load to provide current to the load. A second transistor includes a second control input and third and fourth current terminals, and the first and second control inputs connected together and the first and third current terminals connected together. A third transistor includes a third control input and fifth and sixth current terminals. A fourth transistor includes a fourth control input and seventh and eighth current terminals, and the seventh current terminal is coupled to the fourth and fifth current terminals. An amplifier amplifies a difference between voltages on the second and fourth current terminals. An output of the amplifier is coupled to the third control input and a diode device is connected between the third and fourth control inputs.

19 Claims, 4 Drawing Sheets

CURRENT SENSE CIRCUIT STABILIZED OVER WIDE RANGE OF LOAD CURRENT

RELATED APPLICATIONS

This application claims priority to an India Provisional Application No. 201841024891, filed Jul. 4, 2018, which is hereby incorporated by reference.

BACKGROUND

Current to a load often is sensed for one or more reasons. For example, overload protection may include turning off power to the load when the load current exceeds a threshold. The temperature of the power circuit driving a load exceeding a threshold can damage the power circuit. Consequently, as temperature begins to increase, the current to the load can be reduced to decrease the temperature. For such reasons (or other reasons), the amount of current to a load often is sensed over a range from low levels associated with reducing temperature to high levels associated with over current conditions.

SUMMARY

In one example, a circuit includes a power transistor including a first control input and first and second current terminals, the second current terminal to be coupled to a load to provide current to the load. A second transistor includes a second control input and third and fourth current terminals, and the first and second control inputs connected together and the first and third current terminals connected together. A third transistor includes a third control input and fifth and sixth current terminals. A fourth transistor includes a fourth control input and seventh and eighth current terminals, and the seventh current terminal is coupled to the fourth and fifth current terminals. An amplifier amplifies a difference between voltages on the second and fourth current terminals. An output of the amplifier is coupled to the third control input and a diode device is connected between the third and fourth control inputs.

BRIEF DESCRIPTION OF THE DRAWINGS

For a detailed description of various examples, reference will now be made to the accompanying drawings in which.

DETAILED DESCRIPTION

Figure 1:
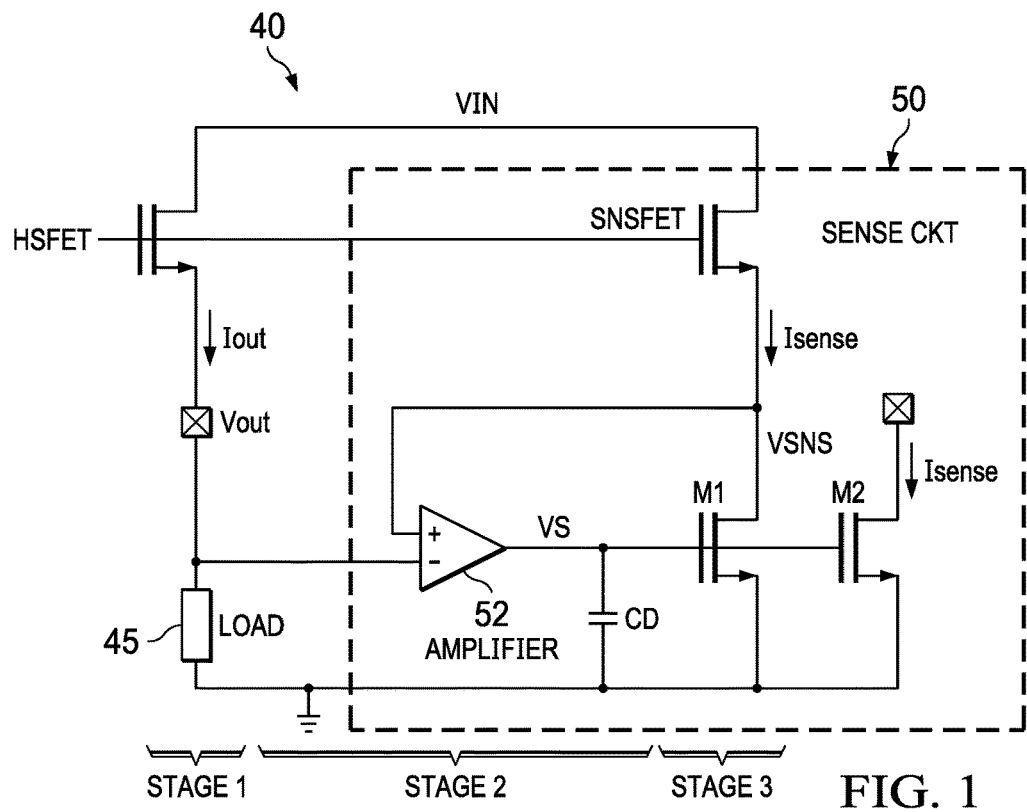
FIG. 1 illustrates a sense circuit to monitor current to a load over a wide range.

FIG. 1 shows an example of a system 40 including a power transistor, which is implemented as metal oxide semiconductor field effect transistor in this example (labeled as "HSFET" in FIG. 1), coupled to a supply voltage node (VIN) and to a load 45. The load 45 may comprise, for example, a programmable logic controller (PLC), a robotic arm, or a microcontroller. The system also includes a sense circuit 50. By asserting a control signal to the gate of HSFET, current Iout is provided from the supply voltage node VIN through HSFET to the load 45.

The sense circuit 50 senses the current Iout to the load. The sense circuit 50 generates a sense current (Isense) that is proportional to (but generally smaller than) Iout and can be used for any of a variety of purposes. For example, overcurrent protection may be implemented to protect the load 45 and/or HSFET from an excessively high output current Iout. An excessively high Iout may damage either or both of HSFET and the load 45. In one example, overcurrent protection may be implemented by monitoring the magnitude of Isense and detecting when Isense exceeds a threshold corresponding to an Iout of, for example, 18 A. Once Isense exceeds that threshold, the gate voltage of HSFET can be reduced to cause a reduction in Iout or HSFET's gate can be pulled down to a level equal to Vout to shut off Iout altogether. Additionally, the temperature of HSFET can be monitored and, if the temperature exceeds a threshold, the level of Iout to the load 45 can be reduced by lowering the gate voltage on HSFET to cause less current to flow through HSFET. The temperature of HSFET can be monitored, for example, by using bipolar junction transistors adjacent HSFET to generate a voltage proportional to absolute temperature referred (PTAT voltage). PTAT voltage (ΔVbe) is given by $$\Delta V_{BE} = \left(\frac{kT}{q}\right)\ln\left(\frac{A2}{A1}\right)$$

where k is the Boltzmann constant, T is temperature in Kelvin, q is charge of an electron, A2 and A1 are areas of bipolar junction transistors used to generate the PTAT voltage. The Isense current produced by the sense circuit 50 continues to be monitored as Iout is reduced. To avoid damage to HSFET, Iout may be lowered to relatively low levels (e.g., 150 mA). Thus, the sense circuit 50 should be able to monitor Iout current over a wide range from, for example, 150 mA to 18 A.

The sense circuit 50 in this example includes an amplifier 52, a capacitor CD, transistors M1 and M2, and sense transistor (SNSFET). Transistors SNSFET and HSFET form a current mirror. The drains of SNSFET and HSFET are connected together, and their gates also are connected together. If the voltages on the sources of HSFET and SNSFET are forced to be approximately equal, then the current through SNSFET (Isense) will track the current through HSFET (Iout). In this example, SNSFET is smaller than HSFET. That is, the ratio of channel width (W) to channel length (L) for SNSFET is smaller than the W/L ratio of HSFET. As such, the ratio of W/L of HSFET to W/L of SNSFET is n:1, where n is greater than 1. This sense ratio means that Isense is (1/n)*Iout. In one example, the W/L ratio of SNSFET is 1/7000th of the W/L ratio of HSFET (i.e., n=7000) and thus Isense is Iout/7000. Isense also flows through M1 to ground. M1 and M2 also form a current mirror. In this example, the W/L ratios of M1 and M2 are approximately equal, and thus the current mirror ratio of the current mirror comprising M1 and M2 is 1:1. As such, the current through M2 also is equal to Isense.

The inputs of the amplifier 52 couple to the sources of SNSFET and HSFET, and thus the amplifier 52 amplifies the difference between the source voltages of SNSFET and HSFET to produce an output voltage (VS) to the gates of M1 and M2. The amplifier 52 is part of a control loop that monitors the difference between the source voltages of SNSFET and HSFET and controls the gate voltage on M1 to regulate the source voltage of SNSFET to be equal to the source voltage on HSFET. The source of SNSFET is connected to the drain of M1 at a node identified as VSNS. The source of HSFET is coupled to the load 45 at a node identified as Vout (the output voltage for load 45). Thus, through the control loop including the amplifier 52, VSNS is continually adjusted to be remain equal to Vout.

In steady state operation of the feedback control loop, the drain current through SNSFET (Isense) equals (1/n)*Iout and VSNS equals Vout. If VSNS deviates slightly from Vout due to, for example, noise coupling from adjacent circuits, a change in loading may occur which causes Vout to change relative to VSNS, and the feedback loop described herein returns VSNS back to the VOUT voltage level. If VSNS, for example, increases slightly above VOUT (e.g., due to charging of a parasitic capacitance on the VSNS node as a result of noise), the drain-to-source voltage (VDS) of SNSFET will decrease and the gate-to-source voltage of SNSFET also will decrease. The current through SNSFET will thus decrease violating the sense ratio between HSFET and SNSFET as VSNS increases. VSNS is coupled to the positive (+) input of the amplifier 52 and Vout is coupled to the negative (−) of the amplifier 52. An increase in the positive input of the amplifier 52 will cause its output voltage VS also to increase (assuming no change in Vout). An increase in VS represents an increase in the VGS of M1, which in turn causes the drain current through M1 to increase. An increase in M1's drain current causes the parasitic capacitance on the VSNS node to discharge thereby reducing the VSNS voltage back to a level equal to VOUT and current through SNSFET increases back to (1/n)*Iout. The speed of this correction depends on the bandwidth of the control loop. For a stable control loop, VSNS will be equal to VOUT in the steady state.

As noted above, the sense circuit 50 should have a wide range of sense current operation. In the example above, Isense may vary between levels corresponding to an Iout range of 150 mA to 18 A. The sense circuit 50 of FIG. 1, however, may experience instability at low Isense current values and also at high Isense values. At a low Isense value, instability can result from a dominant pole of the frequency response of the sense circuit 50 increasing to a higher frequency as Isense decreases, and also as the frequency of the first non-dominant pole (fnd) decreases as Isense decreases. The frequency (fd) of the dominant pole of the sense circuit 50 is given by $$f_d = \frac{1}{2\pi R_s C_D}$$

where Rs is the impedance seen looking into the VS node. As Iout decreases, Isense reduces which means Vs also reduces. When VS reduces, the VDS of a transistor within amplifier 52 (e.g., M362 in the example of FIGS. 3 and 4) reduces which transitions that transistor from the saturation region to the linear region of operation thereby reducing Rs. As a result of the decrease in Rs, the fd frequency increases. The frequency of the first non-dominant pole of the sense circuit 50 is given by fd=1/(2π *R_VSNS*C_VSNS) where C_VSNS is the parasitic capacitance on the VSNS node and R_VSNS impedance on the VSNS node. R_VSNS is given by:

$$R\_VSNS = Rout\_M1 \| (Rout\_SNSFET \| 1/gm\_SNSFET) \approx 1/gm\_SNSFET \quad (1)$$

where Rout_M1 is the resistance of M1 as seen from the VSNS node, Rout_SNSFET is the output resistance of SNSFET as seen from the VSNS node, gm_SNSFET is the transconductance value (gm) of SNSFET, and "||" means that the components are in parallel. The value of gm_SNSFET is given by:

$$gm\_SNSFET = 2 * \frac{Isense}{VOV\_SNSFET} \quad (2)$$

where VOV_SNSFET is the overdrive voltage of SNSFET, that is, the VGS voltage in excess of the transistor's threshold voltage. Per Eq. (2), as Isense decreases (which decreases at a faster rate than VOV_SNSFET decreases), the gm of SNSFET decreases and thus 1/gm of the SNSFET increases. As 1/gm of SNSFET increases, per Eq. (1) R_VSNS also increases and thus fnd decreases. As fd is increasing and fnd is decreasing (as Isense decreases) the phase margin deteriorates causing instability in the loop. An unstable sense circuit will cause oscillations in Iout during current limiting operations because the sensed current Isense itself is oscillating and similarly any other loop that is using Isense information on the same chip also will oscillate. For example, a power limiting loop that uses Isense information may cause oscillations in power delivered to the load.

Figure 2:
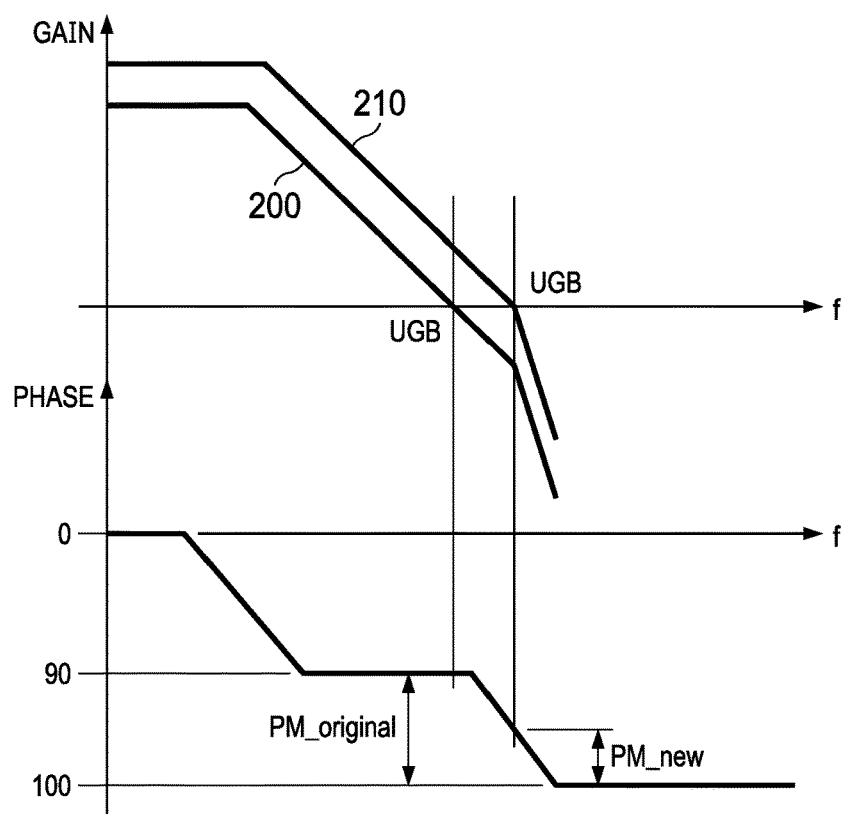
FIG. 2 illustrates the effect on phase margin from a change in gain of the sense circuit of FIG. 1.

Instability also may occur as Isense increases and is near the upper end of the operational range of the sense circuit 50. FIG. 1 illustrates that the system 40 is divided into three stages—stage 1, stage 2, and stage 3. Stage 1 includes HSFET and the load. Stage 2 includes the amplifier 52, and stage 3 includes SNSFET and M1. The gain of stage 3 is a function of the gm of M1 and the on-resistance of the SNSFET when SNSFET is operating in the linear region, that is:

$$gain = gm\_M1 * rdson\_SNSFET \quad (3)$$

where gm_M1 is the gm of M1 and rdson_SNSFET is the on-resistance of SNSFET. Per Eq. (2) above, as current through a FET increases, the gm of the transistor also increases. Thus, as Isense increases, gm_M1 also increases, and per Eq. (3), as gm_M1 increases, the gain of stage 3 increases. Because the gain of stage 3 increases, the overall gain of the system (gains of all three stages multiplied together). FIG. 2 illustrates the increase in gain from gain curve 200 to 201. The frequency locations of the poles remain the same, but the gain increases. The phase-frequency relationship remains unchanged, and as can be seen, the phase margin (phase difference between the phase and 180 degrees at unit gain) decreases from the original phase margin (PM_original) to the phase margin associated with the new gain curve (PM_new), thereby causing instability.

Figure 3:
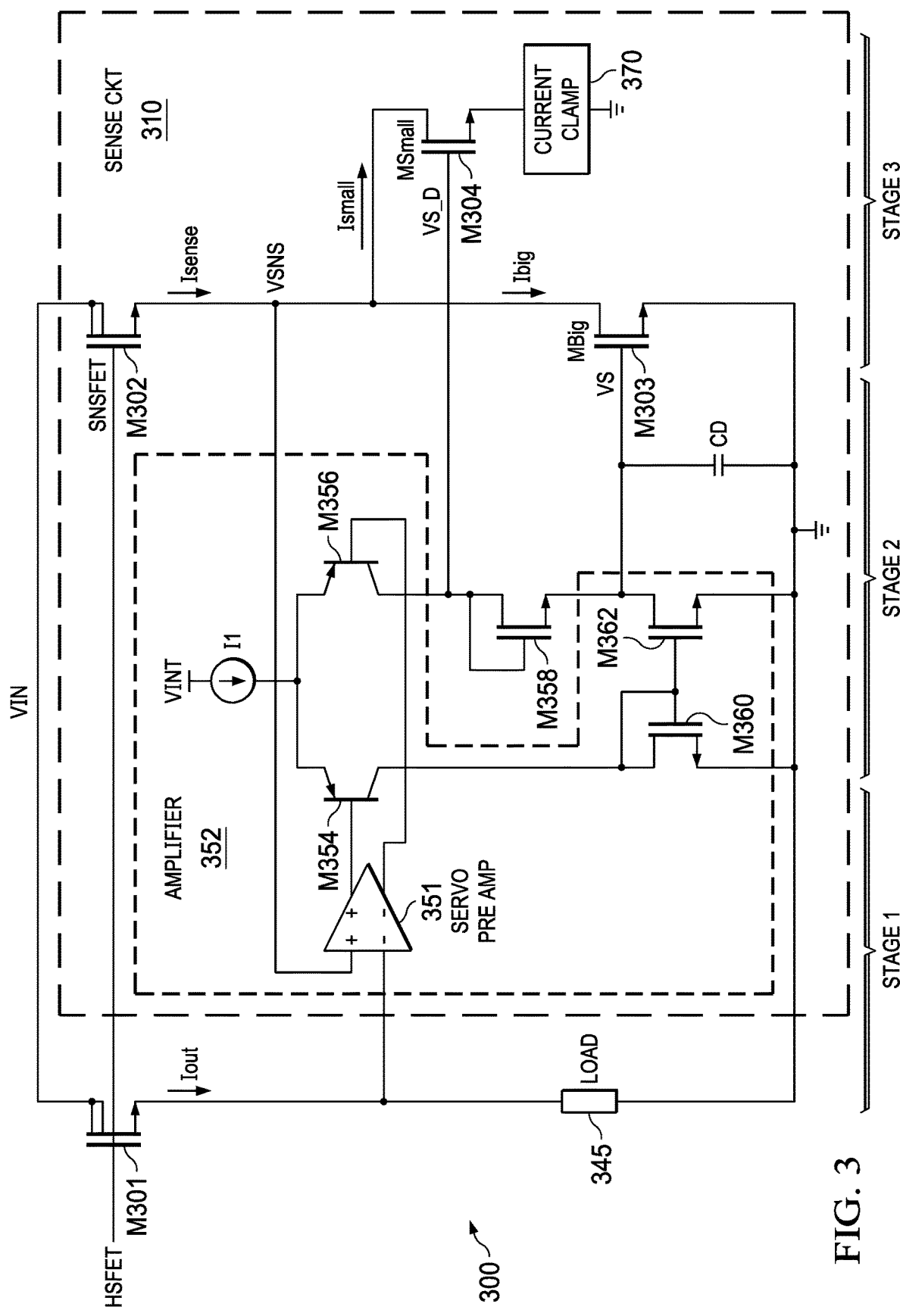
FIG. 3 illustrates a sense circuit to monitor current to a load over a wide range while maintaining stability across the full range.

The disclosed embodiments are directed to a sense circuit that is stable throughout a relatively wide operational range of the sense circuit. That is, the sense circuit is stable both at levels of sense current at the lower end of the operational range and at sense current at the higher levels of the operational range. FIG. 3 is a schematic of a system 300 including a transistor HSFET M301 coupled to a load 345. The system 300 also includes a sense circuit 310 to sense the output current Iout to the load 345 and generate a sense current Isense that is proportional to, and thus is a proxy for, Iout. The sense circuit 310 addresses the instability problems at low and high current levels explained above regarding the sense circuit 50 of FIG. 1.

Reference is made herein to transistors. A transistor has a control input and a pair of current terminals. A metal oxide semiconductor field effect transistor's (MOSFET's) control input is its gate and its current terminals are its drain and source. A bipolar junction transistor's (BJT's) control input is its base and its current terminals are its collector and emitter.

The sense circuit 310 in the example of FIG. 3 includes a two-stage amplifier 352, a sense transistor (SNSFET) M302, transistors MBig M303 and MSmall M304, a current clamp 370, and capacitor CD. The two-stage amplifier 352 includes a servo pre-amplifier 351 as well as transistors M354, M356, M358, M360, and M362 and a current source device I1. Transistors M354 and M356, in this example, comprise p-type bipolar junction transistors (BJTs) and transistors M358, M360, and M362 comprise n-type metal oxide semiconductor field effect transistors (n-type MOSFETS also referred to as NMOS devices). The positive and negative outputs of the servo pre-amplifier 351 are coupled to the base of M354 and the base of M356, respectively. The emitters of M354 and M356 are connected to the current source I1 (I1 refers both to the current source device and the magnitude of the current it produces). The collector of M354 is connected to the drain of M360 and the source of M360 is connected to the ground node. The collector of M356 is connected to the drain of M358 and the source of M358 is connected to the drain of M362. The source of M362 is connected to the ground node. The gates of M360 and M362 are connected together and to the drain of M360. The gate of M358 is connected to its drain. M358 is configured as a diode-connected transistor so that the drain of M358 is approximately 0.7 V higher than the source of M358. The combination of current source I1 and transistors M354, M356, M358, M360, and M362 represent a transistor amplifier.

SNSFET M302 is used to sense current flowing in HSFET M301. The gates of SNSFET M302 and HSFET M301 are connected together, as are their drains (which are also connected to the supply voltage node (VIN). The source of HSFET M301 is coupled to the load 345 and to the negative input of the servo pre-amplifier 351. The source of SNSFET M302 is coupled to the positive input of the servo pre-amplifier 351. The source of transistor M302 is connected to the drains of MBig and MSmall. The source of MBig is connected to the ground node. The source of MSmall is connected to the current clamp 370.

The example system of FIG. 3 includes transistors of specific types. The system, however, can be implemented with transistors of other types. BJTs can be used in place of MOSFETs, MOSFETs in place of BJTs, NMOS devices in place of p-type MOSFETs, etc.

HSFET M301 is of a size that can accommodate relatively large Iout current levels to the load (and thus may be referred to as a power transistor). In one example, the length of HSFET 301 is in the range of 1 micrometers (microns) to 2 microns and its width is in the range of 300 mm to 700 mm. In one example, the width is 570 mm and the length is 1.5 microns. SNSFET M302, in this example, is smaller than HSFET M301. That is, the W/L ratio of channel of SNSFET M302 is smaller than that of HSFET M301. In one implementation, the W/L ratio of HSFET M301 is 7000 times bigger than that of SNSFET M302, and thus the current mirror ratio in that example is 7000:1. The 7000:1 current mirror ratio provides an acceptable balance between power efficiency and accuracy. As the gates of HSFET M301 and SNSFET M302 are connected together, as are their drains, the current through SNSFET M302 (Isense) mirrors that of Iout (albeit smaller in accordance with the current mirror ratio).

Figure 5:
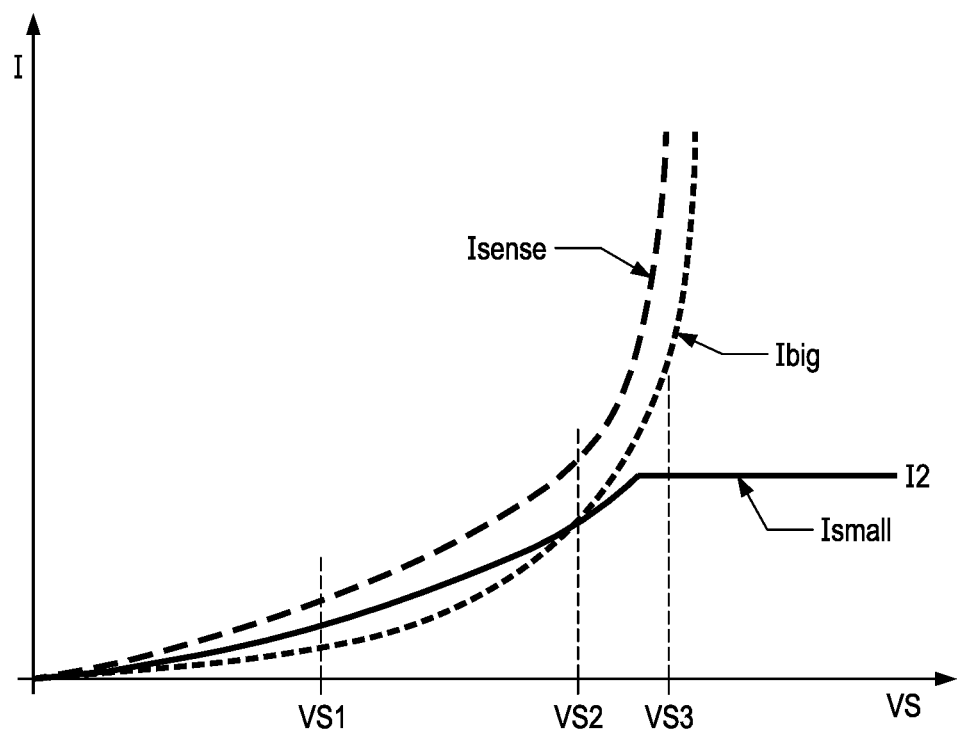
FIG. 5 illustrates the relationship of several currents in the sense circuit of FIG. 4 with respect to an internal node voltage.

Referring still to FIG. 3, MBig M303 also is bigger than MSmall M304. That is, the W/L ratio for MBig M303 is larger than that of MSmall M304. In one example, the W/L ratio for MBig M303 is 40 times larger than that of MSmall M304, which provides an acceptable value in light of an output current of 300 mA. The gate of MBig M303 is the VS voltage from the drain of M362. VS is the output signal from the amplifier 352. The gate of MSmall M304 is coupled to the drain of M358 which provides a voltage labeled as VS_D. M358 is configured as a diode-connected transistor and thus the drain of M358 is approximately 1V higher than its source. Thus, VS_D is approximately 0.7 V higher than VS, which means that the VGS of MSmall M304 is larger than the VGS of MBig M303. At relatively low Iout current levels (e.g., 50 mA to 300 mA), the VS output from amplifier 352 is relatively low (e.g., 50 mV to 150 mV for an output current in the range of 50 mA to 300 mA), and specifically low enough that MBig M303 is either on but conducting very little drain current, or off altogether. However, as the gate of MSmall M304 is biased higher than the gate of MBig M303, MSmall is driven stronger than MBig and thus more current flows through MSmall than MBig. Isense is divided between Ismall current flowing through MSmall M304 and Ibig flowing through MBig M303. At low levels of Isense, because MSmall M304 is driven stronger than MBig M303, Ismall is larger than Ibig. For example, for Iout of 50 mA, more than 90% of Isense flows through Ismall instead of Ibig This low level current effect is illustrated in FIG. 5, which plots Isense, Ibig, and Ismall as a function of VS. At low levels of VS (e.g., VS1), Ismall is larger than Ibig.

The sense circuit 310 is a three-stage circuit in which Stage 1 includes the servo pre-amplifier 351, Stage 2 includes the transistor amplifier comprising current source I1 and transistors M354, M356, M358, M360, and M362, and Stage 3 includes SNSFET, MBig, MSmall and current clamp 370. The gain of Stage 3 is given by:

$$\text{gain} = R(gm\_M\text{Small} + gm\_M\text{big}) \quad (4)$$

where R is the impedance seen at the drain of MSmall M304, gm_MSmall is the transconductance of MSmall M304, and gm_MBig is the transconductance of MBig M303. The transconductances of MSmall and MBig are given as:

$$gm\_M\text{small} = \frac{2 * Ismall}{VOV\_M\text{Small}} \quad (5)$$

$$gm\_M\text{Big} = \frac{2 * Ibig}{VOV\_M\text{Big}} \quad (6)$$

where VOV_MSmall is the overdrive voltage for MSmall M304 and VOV_MBig is the overdrive for MBig M303. As the gate of MSmall M304 is biased higher (approximately 1 V higher) than the gate of MBig M304, the VGS of MSmall M304 is larger than the VGS of MBig M303 and thus the overdrive voltage for MSmall M304 is larger than the overdrive voltage MBig M303. As MSmall's overdrive voltage is relatively large at low levels of Isense, the transconductance for MSmall is relatively small. Further, as relatively little current (Ibig) flows through MBig M303 at low levels of Isense, the transconductance of MBig M303 also is relatively small. Thus, compared to the transconductance of M1 from FIG. 1, the sum of gm_MSmall and gm_MBig is less than gm_M1. Consequently, per the gain equations of Eq. (3) and Eq. (4), the gain of Stage 3 of FIG. 3 is smaller (for small levels of Isense) than the gain of Stage 3 in FIG. 1 at lower levels of Iout. For the sense circuit 310 of FIG. 3, the gain at low levels of Isense decreases by using Mbig and Msmall instead of M1 (FIG. 1). When the total gain, gain from the three stages combined together, decreases for a given position of poles, the loop becomes stable by increasing the phase margin.

The current clamp 370 permits Ismall to increase as Isense increases up until a threshold is reached, at which point Ismall remains relatively constant with further increases in Isense.

Figure 4:
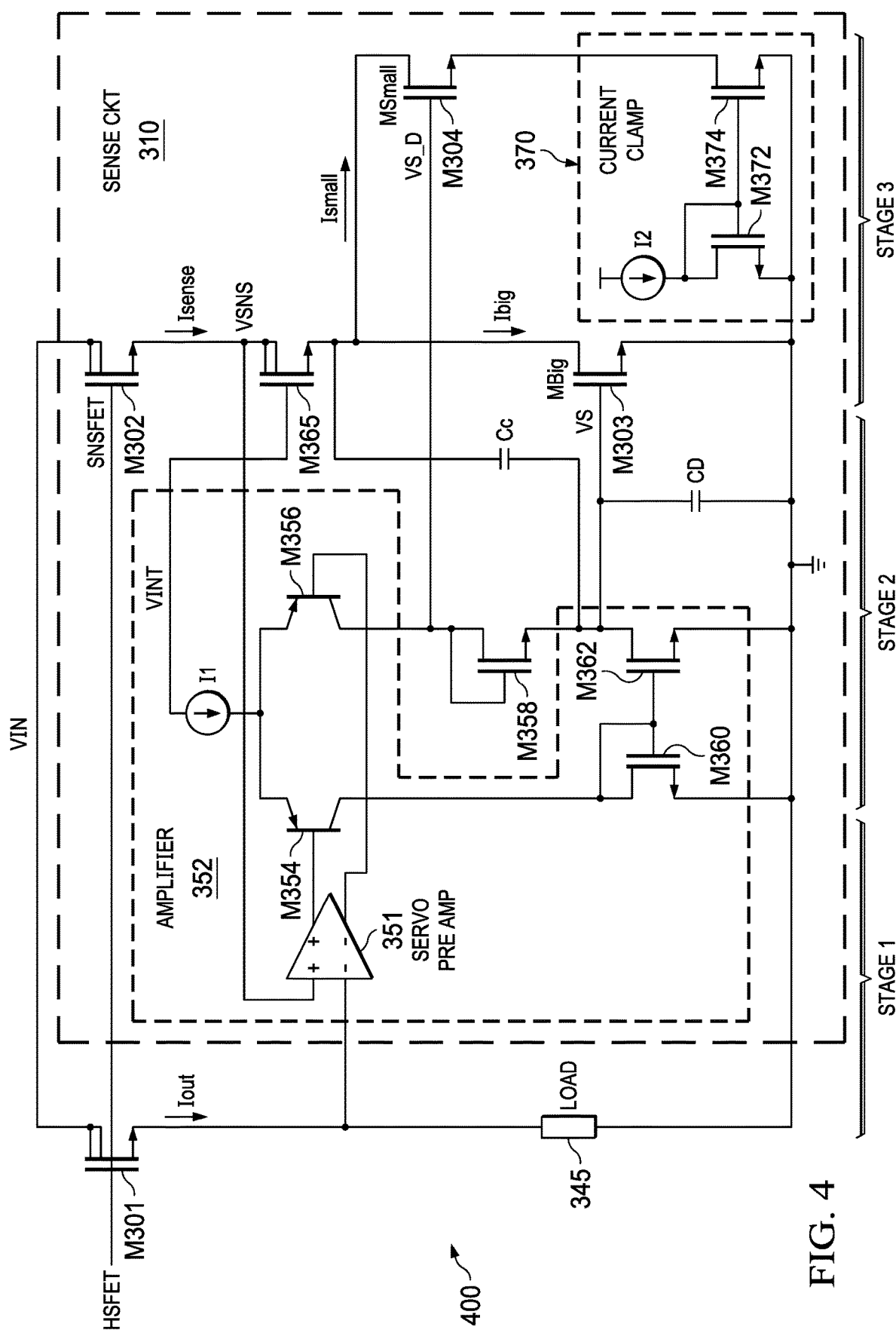
FIG. 4 illustrates another sense circuit to monitor current to a load over a wide range while maintaining stability across the full range.

FIG. 4 is a schematic of a system 400 similar to that of FIG. 3 but with several differences. System 400 includes transistor HSFET M301 coupled to load 345. The system 400 also includes the sense circuit 310 to sense the output current Iout to the load 345 and generate a sense current Isense that is proportional to, and thus is a proxy for, Iout. The sense circuit 310 in the example of FIG. 4 includes the two-stage amplifier 352, SNSFET M302, transistor M365, transistors MBig M303 and MSmall M304, current clamp 370, capacitor CD and a compensation capacitor Cc (compensation capacitor Cc was not included in the example of FIG. 3).

As explained above, SNSFET M302 is used to sense current flowing in HSFET M301. The gates of SNSFET M302 and HSFET M301 are connected together, as are their drains. The source of HSFET M301 is coupled to the load 345 and to the negative input of the servo pre-amplifier 351. The source of SNSFET M302 is coupled to the positive input of the servo pre-amplifier 351, as well as to the drain of transistor M365. The source of transistor M365 is connected to the drains of MBig and MSmall. The source of MBig is connected to the ground node. The source of MSmall is connected to the current clamp 370. The current clamp 370 includes a current source device I2 and transistors M372 and M374. Transistors M372 and M374 comprise NMOS devices, whose gates are connected together. The sources of M372 and M374 are connected to the ground node. The gate of M372 is connected to its drain and the drain of M372 is connected to I2. The source of M304 is connected to the drain of M374.

As noted above, the current clamp 370 permits Ismall to increase as Isense increases up until a threshold is reached, at which point Ismall remains relatively constant with further increases in Isense. In this example, the current clamp 370 includes a current source device I2 coupled to transistor M372 and M374. M372 and M374 comprise NMOS devices whose gates are connected together. The sources of M372 and M374 also are connected together and to the ground node. The gate and drain of M272 are connected together and I2 provides a current through M372. Before the drain current through Msmall reaches the I2 current level, M374 operates in the linear region and the current is controlled by Msmall. However, as the current through Msmall tries to increase above I2, M374 enters the saturation region and controls the current in Msmall and Msmall itself enters the linear region of operation.

In FIG. 5, Ismall is larger than Ibig at low levels of VS. Ismall is capped as shown at I2. As Isense continues to increase, Ibig is permitted to increase but not Ismall. Thus, at larger levels of Isense (e.g., a level corresponding to VS3), Ibig exceeds Ismall. VS2 represents the VS voltage level for which Ibig equals Ismall. Isense is shown in FIG. 4 as the sum of Ismall and Ibig.

As Iout increases, Isense also increases as described above. Once Ismall is capped at I2, Ibig through MBig M303 continues to increase. At higher levels of Isense, the majority of the Isense current flow through MBig M303 instead of MSmall M304 (as MSmall is capped). As explained above regarding the instability problem of the sense circuit 50 of FIG. 1, the gain of Stage 3 increases at larger levels of Isense causing a reduction in the phase margin thereby leading to instability. The inclusion of the compensation capacitor Cc in the example sense circuit 310 of FIG. 4 solves this problem. The compensation capacitor Cc causes the frequency associated with the dominant pole to decrease. The Cc capacitor acts similar to a Miller capacitor, however unlike a Miller capacitor (which stabilizes a circuit for a given location of poles), in the described example, the Cc capacitor helps the dominant pole to track Iout. As Iout, and hence, Isense increases, the gain across Cc increases due to increases in the transconductance (gm) of Mbig. This increased gain moves the dominant pole earlier previously at $fd=1/2\pi RSCD$ to $1/2\pi RS(CD+AvCc)$ where the Av is the gain across the Cc. Av increases as Isense increases and hence the dominant pole frequency reduces as Isense increases to increase the phase margin thereby compensating the phase margin reduction due to increased gain in the loop as explained above. The sense circuit 310 thus remains stable despite an increase in its loop gain at higher sense currents.

The example sense circuit of FIGS. 3 and 4 is a single circuit solution that is stable across a wide load range (e.g., 100 mA to 18 A). The gain of Stage 3 is gradually reduced as Isense tracks lower and lower levels of Iout. By reducing the gain of Stage 3, the sense circuit 310 remains stable at low levels of Iout (Isense). At higher levels of Iout (Isense), the dominant pole is increased thereby avoiding oscillations (instability) that would otherwise occur in the circuit as the gain of Stage 3 increases. The current clamp 370 effectively causes the use of MSmall M304 to be neither a detriment nor a benefit at high levels of Iout (Isense). The progression of Isense as Iout increases or decreases is continuously—that is, there is no discontinuity in operation from a low Iout current level to a high Iout current level. Further still, compared to at least some other sense circuits, the sense circuit 310 of FIG. 1 may be smaller and consume less power.

In this description, the term "couple" or "couples" means either an indirect or direct connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. A circuit, comprising:
   a power transistor including a first control input and first and second current terminals, the second current terminal to be coupled to a load to provide current to the load;
   a second transistor including a second control input and third and fourth current terminals, the first and second control inputs connected together and the first and third current terminals connected together;
   a third transistor including a third control input and fifth and sixth current terminals;

a fourth transistor including a fourth control input and seventh and eighth current terminals, the seventh current terminal coupled to the fourth and fifth current terminals;

an amplifier to amplify a difference between voltages on the second and fourth current terminals, wherein an output of the amplifier is coupled to the third control input; and a diode device connected between the third and fourth control inputs.

2. The circuit of claim 1, including a current clamp connected to the eighth current terminal.

3. The circuit of claim 2, in which the current clamp includes a current source device and a current mirror, the current mirror connected to the eighth current terminal.

4. The circuit of claim 1, in which a ratio of channel width to channel length for the third transistor is greater than a ratio of channel width to channel length for the fourth transistor.

5. The circuit of claim 1, including a compensation capacitor coupled to the output of the amplifier and to the seventh current terminal.

6. The circuit of claim 1, including a fifth transistor including ninth and tenth current terminals, the ninth current terminal connected to the fourth current terminal and the tenth current terminal connected to the fifth and seventh current terminals.

7. The circuit of claim 6, including a compensation capacitor connected to the output of the amplifier and to fifth and seventh current terminals.

8. The circuit of claim 1, in which the diode device comprises a diode-connected transistor.

9. A circuit, comprising:
a power transistor including a first control input and first and second current terminals, the second current terminal to be coupled to a load to provide current to the load;
a second transistor including a second control input and third and fourth current terminals, the first and second control inputs connected together and the first and third current terminals connected together;
a third transistor including a third control input and fifth and sixth current terminals;
an amplifier to amplify a difference between voltages on the second and fourth current terminals, wherein an output of the amplifier is coupled to the third control input;
a compensation capacitor including first and second capacitor terminals, the first capacitor terminal connected to the amplifier output and the second capacitor terminal connected to the fifth current terminal; and
a fourth transistor including a fourth control input and seventh and eighth current terminals, the seventh current terminal coupled to the fourth and fifth current terminals.

10. The circuit of claim 9, in which a ratio of channel width to channel length for the third transistor is greater than a ratio of channel width to channel length for the fourth transistor.

11. The circuit of claim 9, including a diode device connected between the third and fourth control inputs.

12. The circuit of claim 9, including a current clamp connected to the eighth current terminal.

13. The circuit of claim 12, in which the current clamp includes a current source device and a current mirror, the current mirror connected to the eighth current terminal.

14. The circuit of claim 9, including a fifth transistor including ninth and tenth current terminals, the ninth current terminal connected to the fourth current terminal and the tenth current terminal connected to the fifth and seventh current terminals.

15. The circuit of claim 14, in which the second capacitor terminal is connected to the fifth, seventh, and tenth current terminals.

16. A system, comprising:
a load;
a power transistor including a first control input and first and second current terminals, the second current terminal to be coupled to the load to provide current to the load;
a second transistor including a second control input and third and fourth current terminals, the first and second control inputs connected together and the first and third current terminals connected together;
a third transistor including a third control input and fifth and sixth current terminals;
a fourth transistor including a fourth control input and seventh and eighth current terminals, the seventh current terminal coupled to the fourth and fifth current terminals;
an amplifier to amplify a difference between voltages on the second and fourth current terminals, wherein an output of the amplifier is coupled to the third control input;
a diode device connected between the third and fourth control inputs; and
a compensation capacitor coupled to the output of the amplifier and to the seventh current terminal.

17. The system of claim 16, in which a ratio of channel width to channel length for the third transistor is greater than a ratio of channel width to channel length for the fourth transistor.

18. The system of claim 16, including:
a fifth transistor including ninth and tenth current terminals, the ninth current terminal connected to the fourth current terminal and the tenth current terminal connected to the fifth and seventh current terminals; and
a compensation capacitor connected to the output of the amplifier and to fifth, seventh, and tenth current terminals.

19. The system of claim 16, including a current clamp connected to the eighth current terminal.

* * * * *